US008666721B2

(12) United States Patent
Durand et al.

(10) Patent No.: US 8,666,721 B2
(45) Date of Patent: *Mar. 4, 2014

(54) RESOURCE REMAPPING IN A HARDWARE EMULATION ENVIRONMENT

(75) Inventors: Eric Durand, Lu Ville du Bois (FR); Gregoire Brunot, Montrouge (FR); Estelle Reymond, Orsay (FR); Laurent Buchard, Les Ulis (FR)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/487,542

(22) Filed: Jun. 4, 2012

(65) Prior Publication Data

US 2012/0284010 A1  Nov. 8, 2012

Related U.S. Application Data

(63) Continuation of application No. 12/038,770, filed on Feb. 27, 2008, now Pat. No. 8,214,192.

(51) Int. Cl.
*G06F 17/50* (2006.01)
*G06F 9/445* (2006.01)

(52) U.S. Cl.
USPC .................................. 703/13; 703/22; 703/28

(58) Field of Classification Search
USPC ............................................... 703/13, 22, 28
See application file for complete search history.

(56) References Cited

U.S. PATENT DOCUMENTS

| | | | |
|---|---|---|---|
| 5,838,949 A | 11/1998 | Hassoun | |
| 5,903,744 A | 5/1999 | Tseng et al. | |
| 5,963,735 A | 10/1999 | Sample et al. | |
| 6,009,256 A | 12/1999 | Tseng et al. | |
| 6,173,434 B1 | 1/2001 | Wirthlin et al. | |
| 6,230,119 B1 | 5/2001 | Mitchell | |
| 6,266,721 B1 | 7/2001 | Sheikh et al. | |
| 6,445,969 B1 | 9/2002 | Kenney et al. | |
| 6,473,726 B1 | 10/2002 | Reblewski | |

(Continued)

FOREIGN PATENT DOCUMENTS

| | | |
|---|---|---|
| EP | 0651343 | 5/1995 |
| EP | 0935195 | 8/1995 |
| WO | WO 9416210 | 3/1994 |
| WO | WO 0195238 | 12/2001 |

OTHER PUBLICATIONS

Bosi et al., Reconfigurable Pipelined 2-D Convolvers for Fast Digital Signal Processing, IEEE Trasnactions on Very Large Scale Integration (VLSI) Systems, vol. 7, Issue 3, Sep. 1999, pp. 299-308.

Burns et al, A Dynamic Reconfiguration Run-Time System, 5th Annual IEEE Symposium on FPGAs for Custom Computering, Apr. 16, 1997, pp. 266-275.

Ejnioui et al., Design Partitioning on Single-Chip Emu-lation Systems, 13th International Conference on VLSI Design, 2000, pp. 234-239.

(Continued)

*Primary Examiner* — Thai Phan
(74) *Attorney, Agent, or Firm* — Banner & Witcoff, Ltd.

(57) ABSTRACT

A system and method is disclosed in an emulation environment that dynamically remaps user designs. In one embodiment, a request is received to load an integrated circuit design to be emulated in a desired partition within the emulator. The emulator automatically determines the availability of the partition requested. If the partition is not available, the design is dynamically remapped to a different partition that is available. In another embodiment, clocks associated with the integrated circuit design are also dynamically remapped. In yet another embodiment, the user can control the size of the partitions (e.g., the number of printed circuit boards in a partition).

20 Claims, 10 Drawing Sheets

(56) References Cited

U.S. PATENT DOCUMENTS

| | | | |
|---|---|---|---|
| 6,539,535 B2 | 3/2003 | Butts et al. | |
| 6,665,706 B2 | 12/2003 | Kenner et al. | |
| 6,721,922 B1 | 4/2004 | Walters et al. | |
| 6,732,068 B2 | 5/2004 | Sample et al. | |
| 6,839,013 B1 | 1/2005 | Cummins et al. | |
| 6,876,962 B2 | 4/2005 | Reblewski | |
| 7,072,824 B2 | 7/2006 | Halcomb et al. | |
| 7,546,571 B2 | 6/2009 | Mankin et al. | |
| 7,567,894 B2 * | 7/2009 | Durand et al. | 703/28 |
| 7,848,914 B2 * | 12/2010 | Durand et al. | 703/28 |
| 8,214,192 B2 * | 7/2012 | Durand et al. | 703/22 |
| 2001/0020251 A1 | 9/2001 | Sheikh et al. | |
| 2002/0108094 A1 | 8/2002 | Scurry | |
| 2002/0170030 A1 | 11/2002 | Halcomb et al. | |
| 2003/0069724 A1 | 4/2003 | Schubert et al. | |
| 2003/0074177 A1 | 4/2003 | Bowen | |
| 2003/0074178 A1 | 4/2003 | Sample et al. | |
| 2005/0268195 A1 | 12/2005 | Lund et al. | |
| 2009/0182544 A1 | 7/2009 | Durand et al. | |
| 2009/0240457 A1 | 9/2009 | Durand et al. | |
| 2009/0248390 A1 | 10/2009 | Durand et al. | |
| 2009/0299723 A1 * | 12/2009 | Durand et al. | 703/28 |
| 2011/0119045 A1 * | 5/2011 | Durand et al. | 703/28 |

OTHER PUBLICATIONS

Erhard et al., Final Steps Towards a Reconfigurable Asynchronous System, IEEE International Workshop on Rapid System Prototyping, 1999, pp. 28-31.

Jean et al, Dynamic Reconfiguration to Support Concurrent Appolications, IEEE Transactions on Computers, Jun. 1999, IEEE, USA, vol. 48, No. 6, pp. 591-602.

Jean et al., Dynamic Reconfiguration to Support Concurrent Applications, IEEE Symposium on FPGAs for Custom Computing Machines, 1998, pp. 302-303.

Kocan et al., Concurrent D-Algorithm on Reconfigurable Hardware, IEEE/ACM International Conference on Computer-Aided Design, 1999, Digest of Technical Papers, pp. 152-155.

Kumar, Prototyping the M68060 for Concurrent Verification, IEEE Design and Test of Computers, Jan. 1997, pp. 34-41.

Sun et al., Using MATLAB as a Semi-Automated Circuit Emulator with Symbolic Capabilities, IEEE 2000, pp. 253-258.

Snider, Greg, The Teramac Complier, Nov. 29, 1993.

Xilinx, "The Programmable Gate Array Design Handbook" (1986).

International Search Report and Written Opinion for PCT/EP2006/060335, filed Feb. 28, 2006.

* cited by examiner

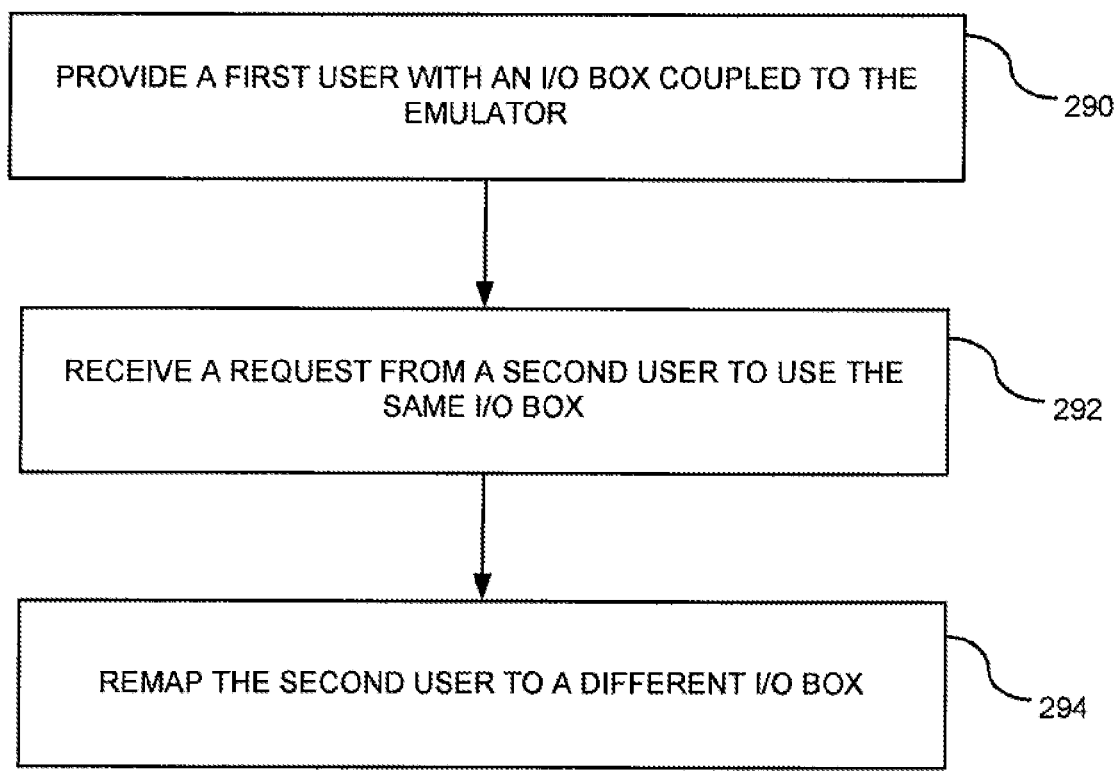

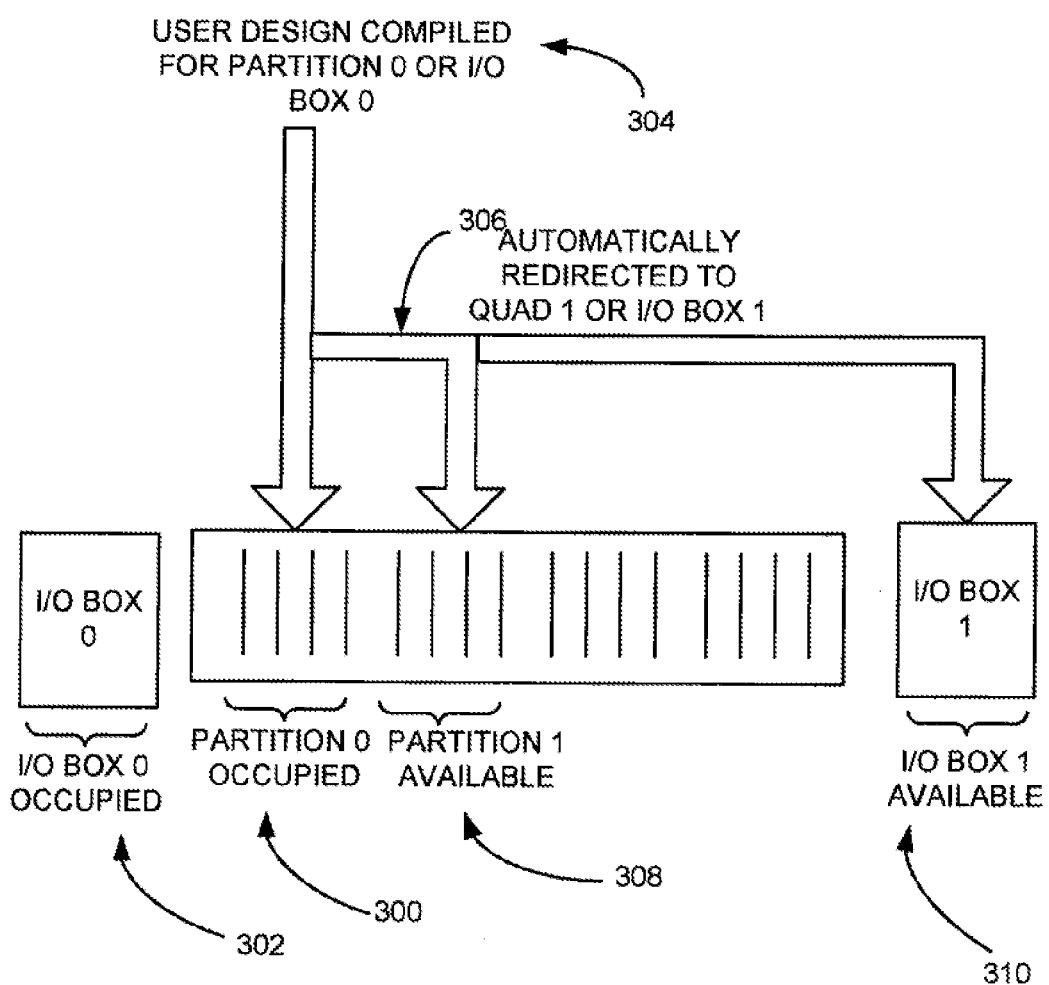

RESOURCE REMAPPING IN A HARDWARE EMULATION ENVIRONMENT

FIELD

The present disclosure generally relates to hardware emulators, and more particularly to remapping resources in a hardware emulator.

BACKGROUND

Today's sophisticated SoC (System on Chip) designs are rapidly evolving and nearly doubling in size with each generation. Indeed, complex designs have nearly exceeded 50 million gates. This complexity, combined with the use of devices in industrial and mission-critical products, has made complete design verification an essential element in the semiconductor development cycle. Ultimately, this means that every chip designer, system integrator, and application software developer must focus on design verification.

Hardware emulation provides an effective way to increase verification productivity, speed up time-to-market, and deliver greater confidence in the final SoC product. Even though individual intellectual property blocks may be exhaustively verified, previously undetected problems can appear when the blocks are integrated within the system. Comprehensive system-level verification, as provided by hardware emulation, tests overall system functionality, IP subsystem integrity, specification errors, block-to-block interfaces, boundary cases, and asynchronous clock domain crossings. Although design reuse, intellectual property, and high-performance tools all help by shortening SoC design time, they do not diminish the system verification bottleneck, which can consume 60-70% of the design cycle. As a result, designers can implement a number of system verification strategies in a complementary methodology including software simulation, simulation acceleration, hardware emulation, and rapid prototyping. But, for system-level verification, hardware emulation remains a favorable choice due to superior performance, visibility, flexibility, and accuracy.

A short history of hardware emulation is useful for understanding the emulation environment. Initially, software programs would read a circuit design file and simulate the electrical performance of the circuit very slowly. To speed up the process, special computers were designed to run simulators as fast as possible. IBM's Yorktown "simulator" was the earliest (1982) successful example of this—it used multiple processors running in parallel to run the simulation. Each processor was programmed to mimic a logical operation of the circuit for each cycle and may be reprogrammed in subsequent cycles to mimic a different logical operation. This hardware 'simulator' was faster than the current software simulators, but far slower than the end-product ICs. When Field Programmable Gate Arrays (FPGAs) became available in the mid-80's, circuit designers conceived of networking hundreds of FPGAs together in order to map their circuit design onto the FPGAs so that the entire FPGA network would mimic, or emulate, the entire circuit. In the early 90's the term "emulation" was used to distinguish reprogrammable hardware that took the form of the design under test (DUT) versus a general purpose computer (or work station) running a software simulation program.

Soon, variations appeared. Custom FPGAs were designed for hardware emulation that included on-chip memory (for DUT memory as well as for debugging), special routing for outputting internal signals, and for efficient networking between logic elements. Another variation used custom IC chips with networked single bit processors (so-called processor based emulation) that processed in parallel and usually assumed a different logic function every cycle.

Physically, a hardware emulator resembles a large server. Racks of large printed circuit boards are connected by backplanes in ways that most facilitate a particular network configuration. Typically, a workstation connects to the hardware emulator for control, input, and output. Before the emulator can emulate a DUT, the DUT design must be compiled. That is, the DUT's logic must be converted (synthesized) into code that can program the hardware emulator's logic elements (whether they be processors or FPGAs). Also, the DUT's interconnections must be synthesized into a suitable network that can be programmed into the hardware emulator. The compilation is highly emulator specific and can be time consuming.

Compilation inefficiencies are particularly problematic in a multi-user emulation environment or where the emulator has faulty resources. For example, two designs may be separately compiled, both directed to using the same resources in the emulator. In such a case, one of the designs will not properly load in the emulator. That design must then be re-compiled, which is slow and inefficient.

Thus, it is desirable to provide an emulator environment with the ability to handle multi-user designs, and/or to handle conflicts when the design cannot properly load into the emulator.

SUMMARY

The present disclosure provides a system and method in an emulation environment that remaps a user design from one emulator resource to another.

In one embodiment, a request can be received to load an integrated circuit design to be emulated in a desired partition within the emulator. The emulator automatically determines the availability of the partition requested. If the partition is not available, the design can be remapped to a different partition that is available. A partition can be deemed or determined to be unavailable, for example, based on one or more criteria, such as on or more of the following: faults in the partition that prevent proper emulation, current use of the partition by another design, or other reasons for unavailability are determined to have been met, such as based on rules of availability according to the emulator design.

Remapping can be accomplished dynamically. For example, during the emulation of one user design, another user design can be remapped in real-time without interrupting the already running emulation.

In another embodiment, clocks associated with the integrated circuit design can be also remapped to the selected partition.

In yet another embodiment, the size of the partitions (e.g., the number of printed circuit boards in a partition) can be controlled, such as by the user or in accordance with rules.

The foregoing and other objects, features, and advantages of the invention will become more apparent from the following detailed description, which proceeds with reference to the accompanying figures.

BRIEF DESCRIPTION OF THE DRAWINGS

FIG. 9 is a flowchart of an embodiment for remapping an I/O box.

FIG. 10 is an illustration of an embodiment showing remapping generally of a design to a different partition and/or to an I/O box.

DETAILED DESCRIPTION

Disclosed below are representative embodiments of electronic circuit testing techniques and associated apparatus that should not be construed as limiting in any way. Instead, the present disclosure is directed toward all novel and nonobvious features and aspects of the various disclosed methods, apparatus, and equivalents thereof, alone and in various combinations and subcombinations with one another. The disclosed technology is not limited to any specific aspect or feature, or combination thereof, nor do the disclosed methods and apparatus require that any one or more specific advantages be present or problems be solved.

As used in this application and in the claims, the singular forms "a," "an" and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements.

Although the operations of some of the disclosed methods and apparatus are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures do not show the various ways in which the disclosed methods and apparatus can be used in conjunction with other methods and apparatus.

Any of the methods described herein can be performed (at least in part) using software comprising computer-executable instructions stored on one or more computer-readable media. Furthermore, any intermediate or final results of the disclosed methods can be stored on one or more computer-readable media. For example, a software tool can be used to determine and store one or more control signals used to control any of the disclosed apparatus. Any such software can be executed on a single computer or on a networked computer (for example, via the Internet, a wide-area network, a local-area network, a client-server network, or other such network). For clarity, only certain selected aspects of the software-based implementations are described. Other details that are well known in the art are omitted. For the same reason, computer hardware is not described in further detail. It should be understood that the disclosed technology is not limited to any specific computer language, program, or computer. For instance, a wide variety of commercially available computer languages, programs, and computers can be used.

Figure 1:
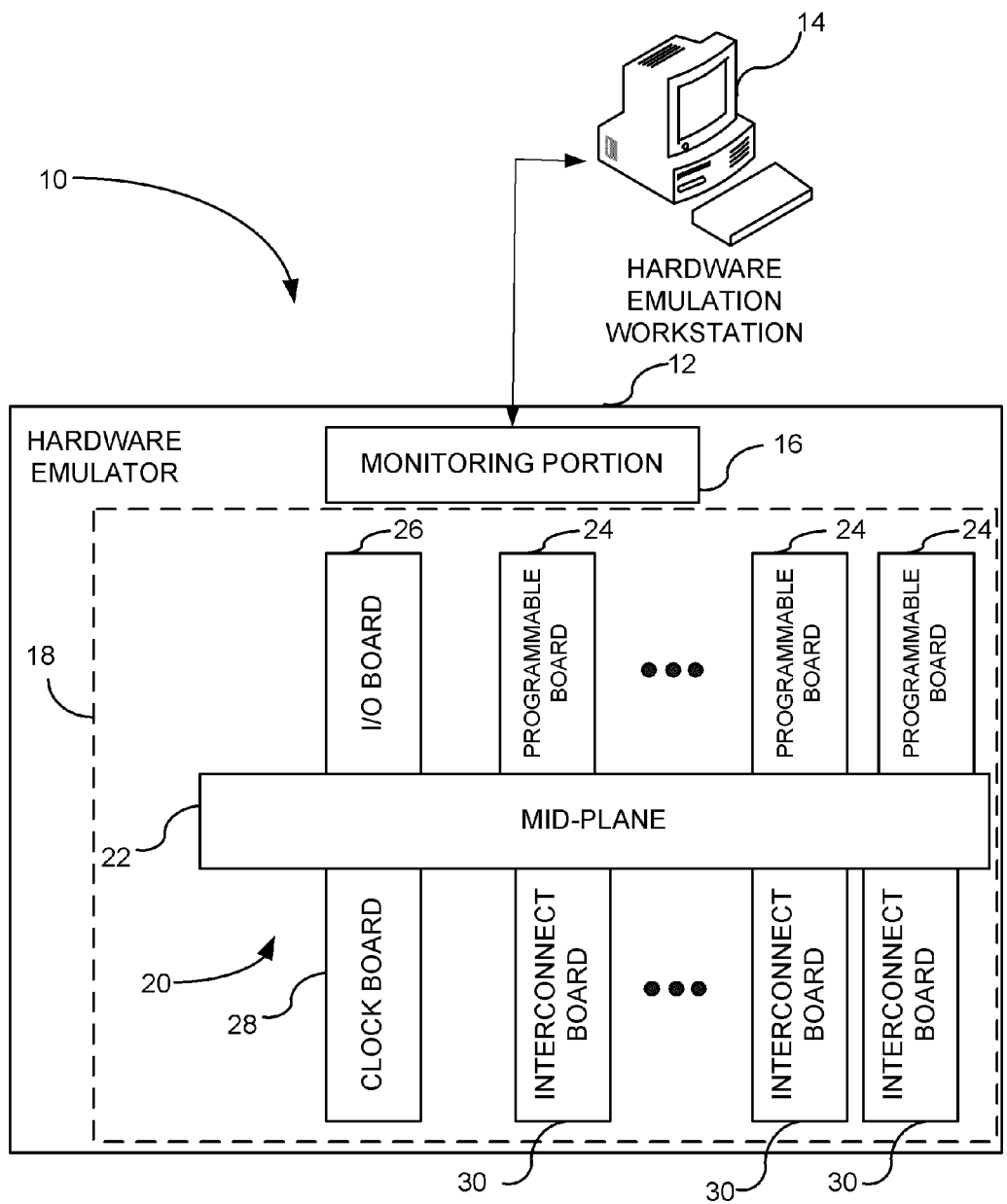
FIG. 1 is a system diagram of an exemplary hardware emulator environment.

FIG. 1 shows an embodiment of an emulator environment 10 including a hardware emulator 12 coupled to one or more hardware emulator hosts 14. The emulator host 14 can be any desired type of computer hardware and generally can include a user interface through which a user can load, compile and download a design to the emulator 12.

The emulator 12 can include a monitoring portion 16 and an emulation portion 18. The emulation portion 18 can include multiple printed circuit boards 20 coupled to a midplane 22. The midplane 22 can allow physical connection of the printed circuit boards into the emulator 12 on both sides of the midplane. A backplane can also be used in place of the midplane, the backplane allowing connection of printed circuit boards on one side of the backplane. Any desired type of printed circuit boards can be used. For example, programmable boards 24 generally can include an array of FPGAs, VLSIs or ICs, or other programmable circuitry, that can be programmed with the user's design downloaded from the emulator host 14. One or more I/O board interfaces 26 can allow communication between the emulator 12 and hardware external to the emulator. For example, the user can have a preexisting processor board that is used in conjunction with the emulator and such a processor board connects to the emulator through I/O board interface 26. A clock board 28 can be used to generate any number of desired clock signals. The interconnect boards 30 can allow integrated circuits on the programmable boards 24 to communicate together and with integrated circuits on the I/O board interface 26. Any combination of the above-mentioned boards may be used and any boards may be omitted. Additionally, it may be desirable in some applications to omit the midplane or backplane and use a different connection scheme.

Figure 2:
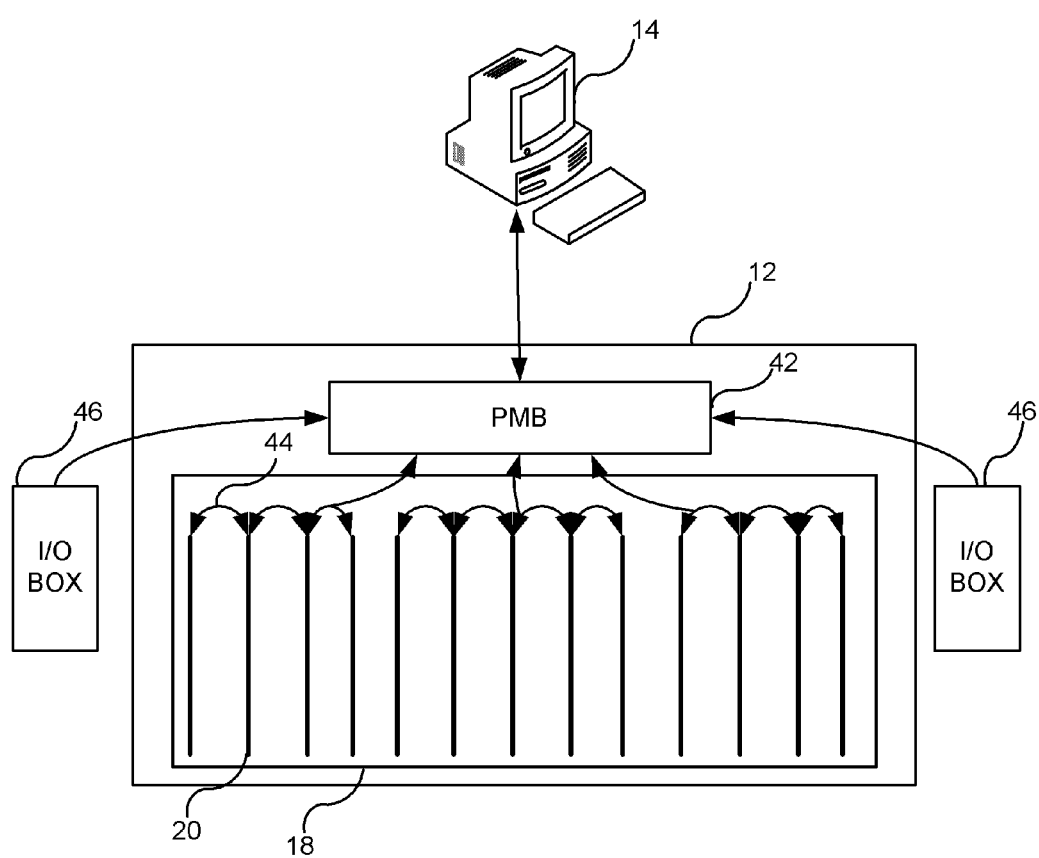
FIG. 2 is a more detailed exemplary system diagram showing a host computer coupled to the emulator through an intermediate platform maintenance board.

FIG. 2 shows a more detailed view of the system. The host computer 14 can be equipped with a high-speed-link PCI board coupled to a platform maintenance board (PMB) 42, which can act as the monitoring portion 16. The PMB 42 can monitor various physical parameters in the emulator portion 18 and can create the interface between the emulator portion 18 and the one or more host computers 14. The PMB 42 can, for example, on a periodic basis (e.g., 10 seconds), transmit communication and monitoring reports to the host workstation 14 for display in the GUI. Similarly, the PMB 42 can receive information regarding the physical parameters of the emulator portion 18, such as periodically. For example, hardware (e.g., an FPGA) on each printed circuit board 20 can have intelligence for monitoring physical parameters on its respective board and for sending this physical information to the PMB (e.g., every 5 seconds). Other changes, such as a detected error, can be transmitted immediately upon and in response to the detection. Thus, the PMB 42 can in one embodiment instantaneously (as opposed to periodically) detect any changes in the emulation environment 10 and can generate real-time state change messages to the host station 14. All of the physical parameters obtained through the PMB can be obtained while the emulator portion 18 is performing emulation. Thus, several emulations can be separately running and the physical parameters of the emulator can be separately viewed on the GUI of the host computers. However, there need not be a link between the number of simultaneous emulations and the number of workstations. For example, many emulations can be simultaneously run through one workstation. IO boxes 46 allow connection of other user boards to the system. The IO boxes 46 can also be coupled to the PMB 42 and monitored thereby.

Figure 3:
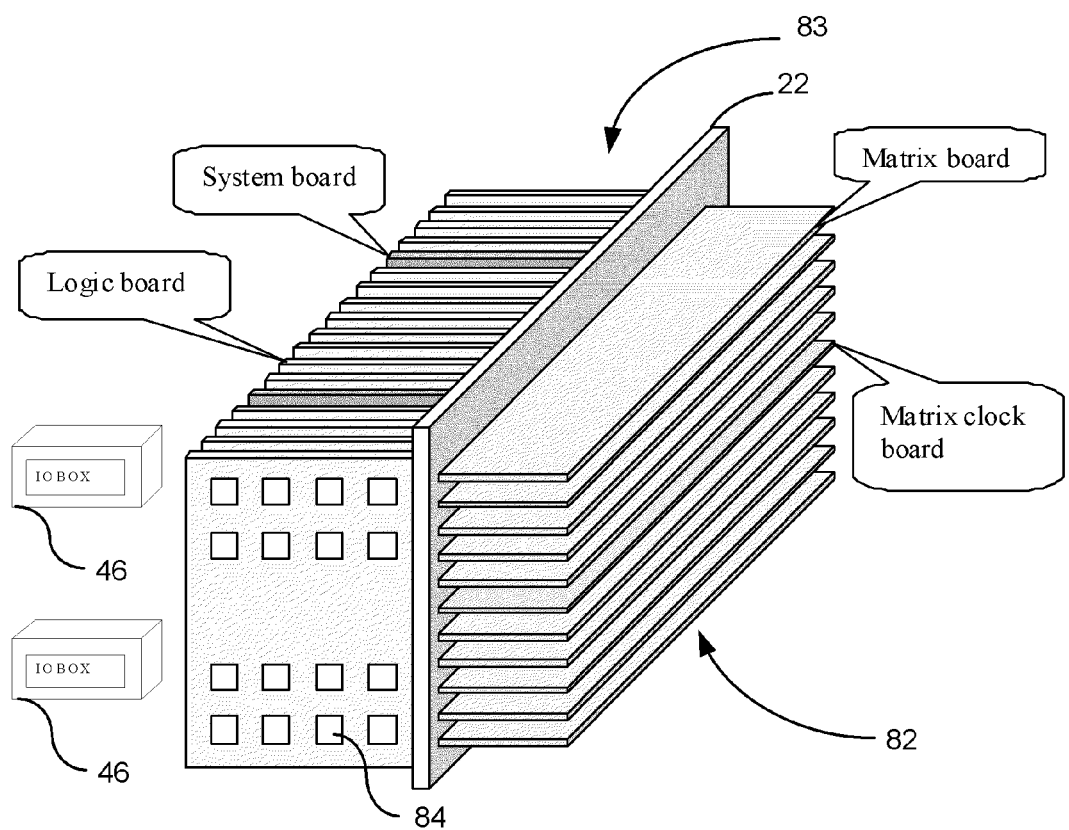
FIG. 3 is a three-dimensional physical view of an exemplary system in accordance with FIG. 1.

FIG. 3 shows an embodiment of a physical three-dimensional view of a single emulator chassis, which corresponds to the emulator portion 18, including the midplane 22 having horizontal boards 82 coupled to one side of the midplane, and vertical boards 83 coupled to the opposite side of the midplane. The physical integrated circuits are shown at 84. The IO boxes 46 can sit separately and are typically not generally considered part of the emulator.

Figure 4:
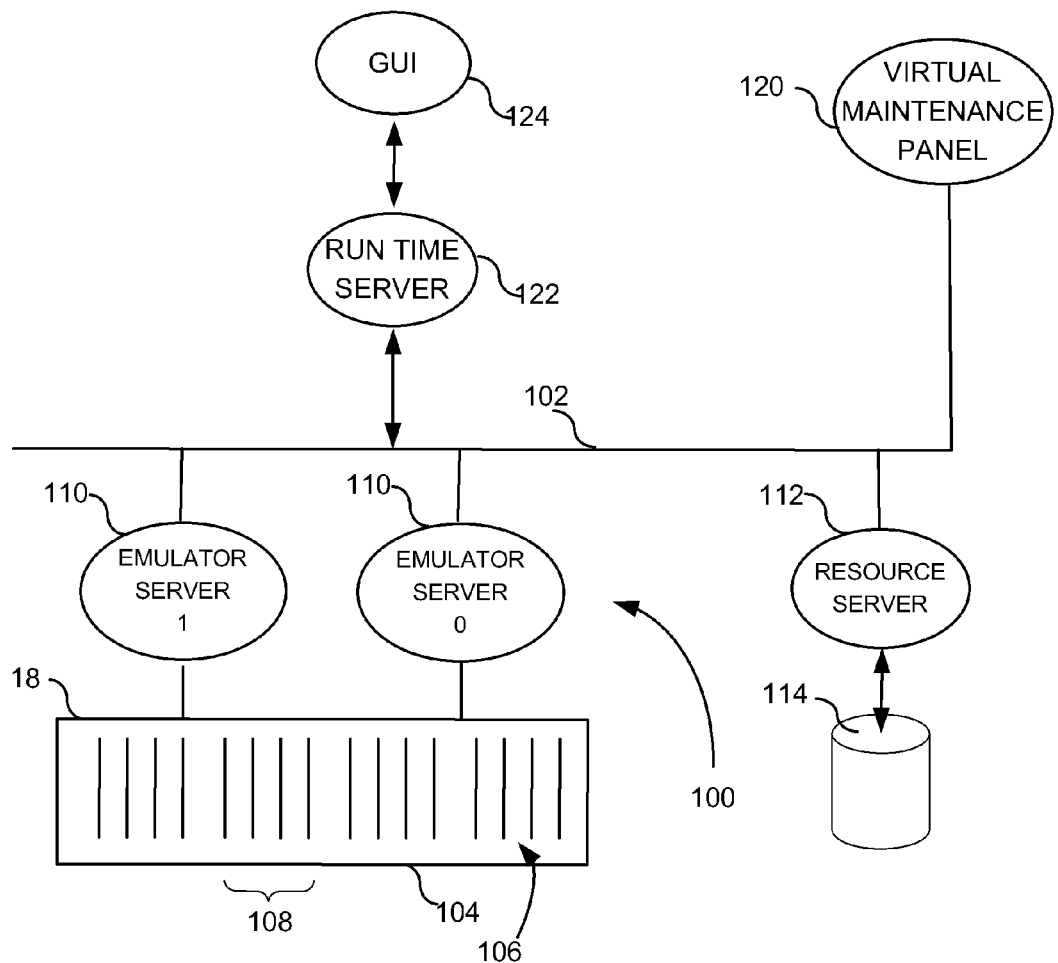
FIG. 4 is a high-level system diagram of an embodiment showing various servers connected through a messaging bus.

FIG. 4 shows a view of an embodiment of the emulator system including various servers 110 (collectively indicated by number 100) that, in this embodiment, can communicate with one another, such as through a messaging bus 102. The emulator of FIG. 4 can be a single chassis emulator, as shown at 104, but the emulator can include a plurality of chassis. Each chassis can include any number of printed circuit boards, shown generally at 106, but in the illustrated embodiment there are sixteen printed circuit boards. The printed circuit boards can be divided into partitions, such as the partition 108. A partition can be a set of one or more printed circuit boards, such as, for example, can be defined by the user, but in this embodiment a partition includes four printed circuit boards. By changing the size of the partitions, the user can change the granularity of the system. Emulator servers 110 can be in charge of managing a physical host connection to the emulator and can provide for the transfer of data between the emulator messaging bus 102 and the emulation portion 18. Any number of emulator servers 110 can be added. In one specific example there is one emulator server for each design being run in the emulator. A resource server 112 can be in charge of managing the different emulator resources provided to the applications. The resource server 112 can communicate with a resource database 114 that stores information about resources available for use. For example, the resource database 114 can store information about which printed circuit boards are in current use or allocated to other designs being emulated. Such boards can be deemed not be available to other designs. The database can also store information about faults on any of the printed circuit boards 106. Information about faults and printed circuit boards in use can be communicated to the resource server 112, such as through the monitoring portion 16 of FIG. 1. A virtual maintenance panel (VMP) 120, in this example, can be the main user interface through which the user can control the system, monitor and control the emulators 110. A run-time server 122 can receive instructions through a GUI 124 and can interact with the emulator servers 64 to receive data from the emulator servers and provide control information to the emulator servers.

Figure 5:
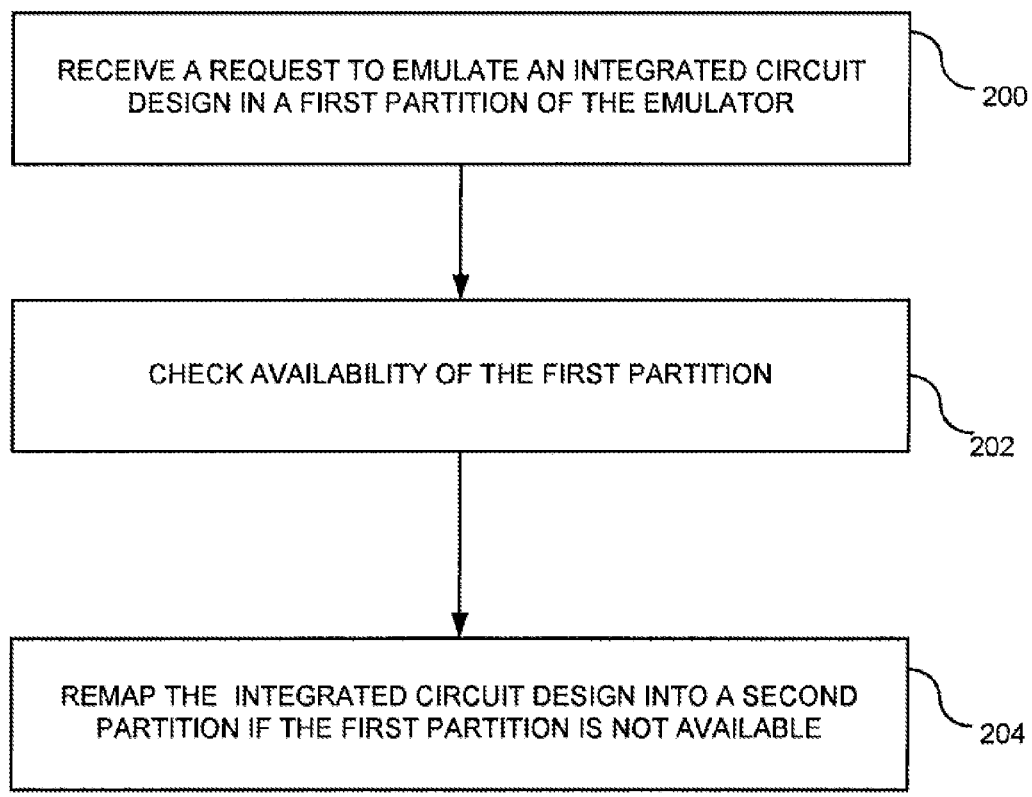
FIG. 5 is a flowchart of an embodiment of a method for remapping an integrated circuit design.

FIG. 5 is a flowchart of an embodiment for remapping an integrated circuit design. In process block 200, a request can be received (e.g., by the run-time server 122) for emulating an integrated circuit design. The integrated circuit design can be compiled including a designation of one or more printed circuit boards or partitions. However, the run-time server does not necessarily automatically attempt to download the design to the emulation portion 18. Instead, the run-time server 122 can check the availability of resources in the emulator needed to emulate the design (process block 202). For example, the run-time server can send a request to the resource server 112 to determine whether the emulation portion 18 has the availability of resources. The availability can depend on whether one or more criteria or reasons for unavailability are met, such as whether the resources are already being used, by the inadequacy of resources due to faults, or other reasons dictated by rules set up by the emulator. An example of a basic remapping rule is that when a user goes through the resource reservation process, the resource server 112 can first look for the smallest partition available that fits the user design. Thus, a priority is given for keeping the highest populated partitions available to the next users. In process block 204, one or more of the emulator servers 110 can dynamically remap the integrated circuit design into a different partition 108 than was originally requested and which is different from the partition designated at compilation. The remapping can be accomplished dynamically, e.g., "on the fly" in real-time without interrupting an emulation that is in process. For example, dynamically remapping includes loading the design into a different location in the emulator than indicated in the request without interrupting any existing emulation that is in progress.

Figure 6:
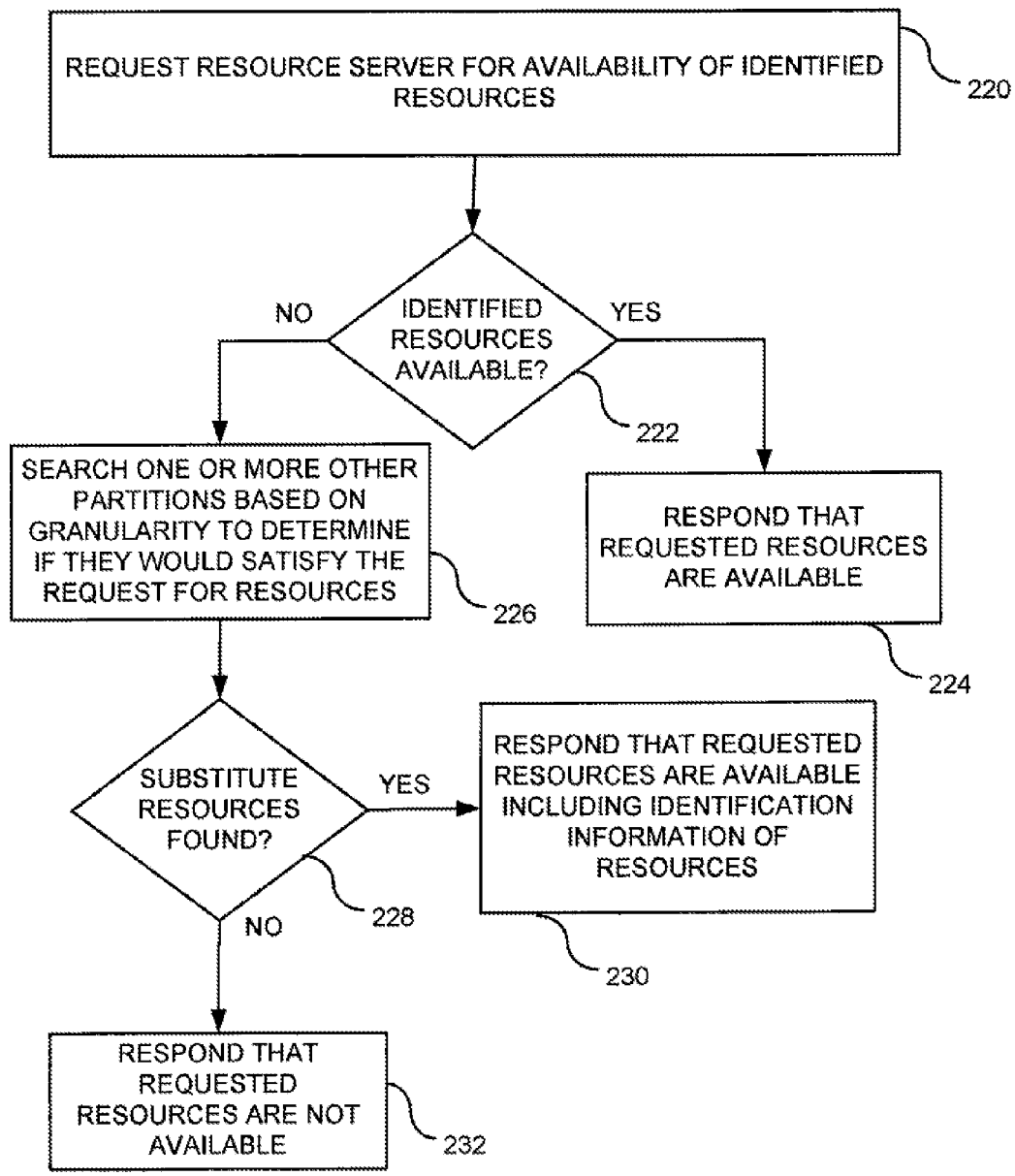
FIG. 6 is a flowchart of an embodiment showing further details of remapping an integrated circuit design.

FIG. 6 is a flowchart of an embodiment showing further details of process block 202 of FIG. 5. In process block 220, the run-time server 122 can request the resource server 112 for availability of the resources identified in the user request. In decision block 222, the resource server 112 can check the database 114 to determine whether the identified resources are available for use and whether they contain any faulty components that could prevent the emulation from properly running. If the decision is answered in the affirmative, then in process block 224, the resource server 112 can send a message to the run-time server that resources are available. The run-time server can then direct the appropriate emulator server to proceed. If the decision is answered in the negative, then in process block 226, the resource server 112 can search the next partition 108 in sequence using the database 114. If that next partition is not available, then the subsequent partition can be analyzed and so on. The size of the partitions can be modified by the user so as to affect the granularity of the decision making process. For example, the partitions can include any number of one or more printed circuit boards. In the illustrated example, the partitions are four boards. In decision block 228, the resource server analyzes the results of the database search to determine if substitute resources are available. If alternative resources are available, then in process block 230, the resource server 112 can respond to the run-time server 122 that resources are available. Additionally, an identification of the partition into which the design can be loaded can be provided to the run-time server 122. If there are no resources available, then in process block 232, the resource server 112 can return a message to the run-time server that there are no available resources to handle the request.

Figure 7:
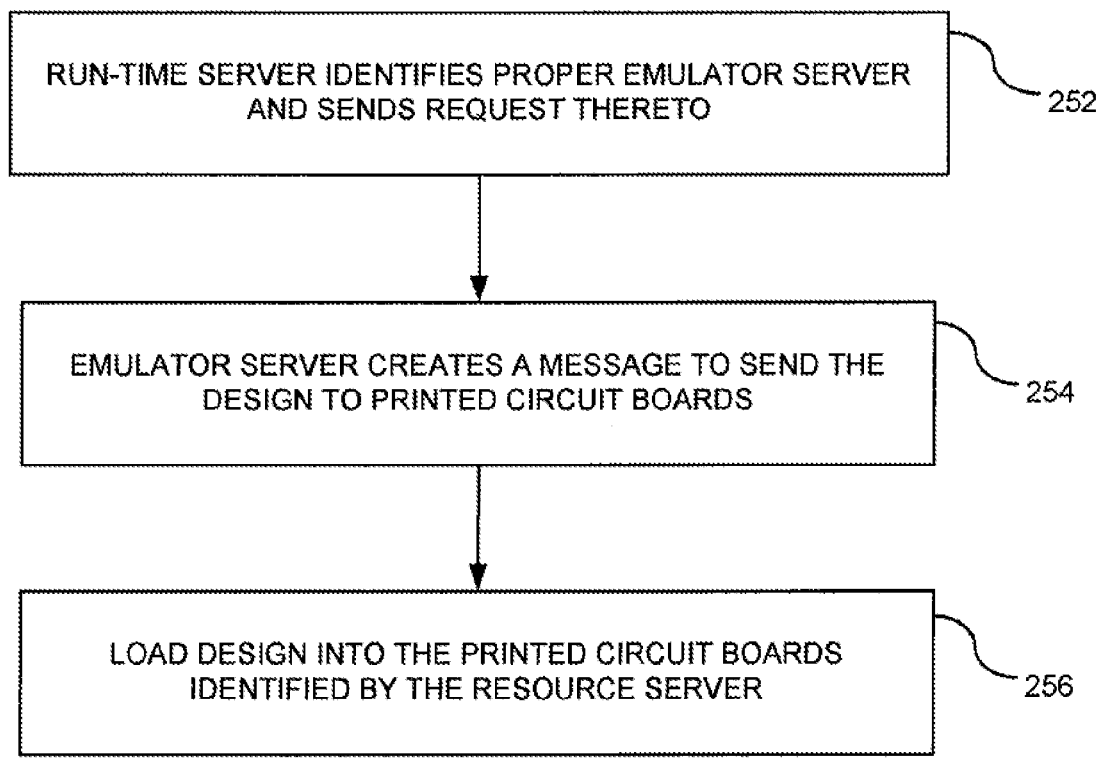
FIG. 7 is a flowchart of an embodiment showing further details of remapping an integrated circuit design.

FIG. 7 is a flowchart of an embodiment showing further details of process block 204 of FIG. 5. In process block 252, the run-time server 122 can use the response received from the resource server 112 to identify a proper emulator server 110 associated with the partition where the design is to be loaded. The run-time server can then send the request to the emulator server. In process block 254, the emulator server can create a message to send the design to the printed circuit boards 106 in the emulation portion 18. In process block 256, the design can be loaded into the printed circuit boards identified by the resource server.

Figure 8:
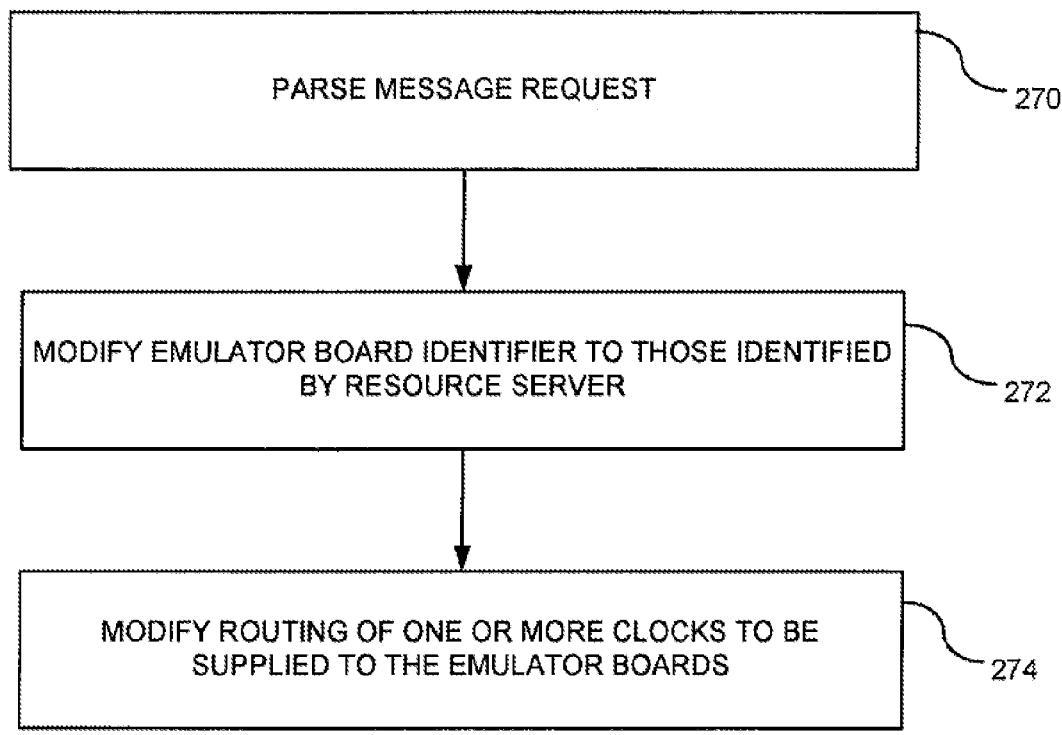
FIG. 8 is a flowchart of an embodiment showing details of an exemplary method performed by an emulator server in order to remap an integrated circuit design.

FIG. 8 is a flowchart of an embodiment showing further details of process block 254 of FIG. 7. In process block 270, the emulator server 110 can parse the message request to separate an identifier (e.g., address) of printed circuit boards from data associated with the request. In process block 272, the emulator server can modify the identifier of the printed circuit boards to those boards indicated to be available by the resource server. In process block 274, the emulator server can also re-route clocks to be supplied to the emulator boards. Such re-routing effectively changes the clock speed to the emulator boards. The re-routing can be accomplished by redirecting or reprogramming the clocks on clock board 28 to pass to the desired printed circuit boards into which the design is loaded. Returning to FIG. 1, the reprogramming can occur by re-routing the clocks from clock board 28 through interconnect boards 30 to the desired programmable boards 24.

FIG. 9 is a flowchart of an embodiment showing remapping of an I/O box 46 (see FIG. 3) associated with the emulation. In process block 290, a first user can be provided an I/O box coupled to the emulator. Consequently, the first user can load their design into the I/O box. In process block 292, a request can be received from a second user to use the same I/O box. As before, the resource server 112 can identify that there is an overlap in resources between the first user and the request. As a result, in process block 294, the request can be remapped into a second I/O box. Such remapping occurs dynamically while the emulator is emulating the first user's design. Additionally, the second user preferably does not need to re-compile the design and the remapping occurs automatically without user intervention.

FIG. 10 is an illustration depicting an example of dynamic remapping. As indicated at 300, partition 0 can be occupied and/or I/O box 0 can be occupied as shown at 302. A user design can be compiled for partition 0 and/or I/O box 0 as shown at 304. Arrow 306 shows that the design can be automatically remapped to partition 1, shown at 308 and/or I/O box 1, shown at 310. It should be recognized that the remapping occurs without affecting a design being emulated in partition 0 or I/O box 0.

Having described and illustrated the principles of illustrated embodiments, it will be recognized that the embodiments can be modified in arrangement and detail without departing from such principles.

For example, as a consequence of remapping, the interconnect boards can be dynamically reprogrammed when more than one programmable board is needed for supporting a user design. Such reprogramming allows for programmable board interconnection that is transparently programmed prior to downloading the design to the emulator, keeping equivalent resources interconnected even though other boards than the default boards are being used.

An example of the flexibility provided by certain embodiments is that for customers that have multiple emulators of the same type, the remapping feature provides a way for users to compile a design once in a generic mode for being able to download the design on any of those emulators whenever one is available, optimizing the use time of the hardware resources by queuing the runtime application.

Another example of the flexibility in certain embodiments is that a customer that installs identical targets on different I/O boxes can compile the design only once and still have the ability to keep using a particular target even though the logic boards are being remapped. The customer can request to use a particular target whenever the logic boards are remapped.

In view of the many possible embodiments to which the principles of the disclosed invention may be applied, it should be recognized that the illustrated embodiments are only examples of the invention and should not be taken as limiting the scope of the invention. Rather, the scope of the invention is defined by the following claims. We therefore claim as our invention all that comes within the scope and spirit of these claims.

We claim:

1. A method, comprising:
   receiving a request to load an integrated circuit design to be emulated in a first partition of one or more printed circuit boards in a hardware emulator;
   determining availability of the one or more printed circuit boards in the first partition; and
   if the determination is that the one or more printed circuit boards in the first partition are not available, remapping the integrated circuit design into a second partition of one or more printed circuit boards that are available.

2. The method of claim 1, wherein the determining of the availability comprises checking for one or more of the following: (a) if the first partition of one or more printed circuit boards are in use; (b) if the first partition contains a fault that affects emulation of the integrated circuit design; and (c) if the first partition complies with at least one rule in a set of rules for determining availability.

3. The method of claim 2, wherein the remapping includes checking each partition in the emulator in sequence until an available partition is found.

4. The method of claim 1, wherein the request includes an identification of a partition to be used, and wherein the remapping includes using a partition that is different from the identified partition without recompiling the integrated circuit design.

5. The method of claim 1, wherein the remapping includes switching one or more clocks associated with the integrated circuit design to the second partition.

6. The method of claim 5, wherein the switching of the one or more clocks includes programming the one or more clocks to a speed needed by the integrated circuit design.

7. The method of claim 1, wherein the remapping includes parsing the request into a partition address portion and a data portion and changing the partition address portion based on the remapping.

8. The method of claim 1, wherein a first user design is being emulated in the first partition at a time of receiving the request, and the remapping occurs without affecting the first user design.

9. The method of claim 1, wherein a user can define a partition size so as to affect a granularity of the remapping.

10. The method of claim 1, wherein the remapping occurs while a user design is being emulated in the first partition without disrupting that emulation.

11. A hardware emulator, comprising:
    first and second partitions each having one or more printed circuit boards;
    one or more computers; and
    one or more computer readable media storing computer-executable instructions, that when executed by the one or more computers, cause the hardware emulator to:
    receive a request to load an integrated circuit design to be emulated in the first partition of one or more printed circuit boards;
    determine availability of the one or more printed circuit boards in the first partition; and
    if the determination is that the one or more printed circuit boards in the first partition are not available, remap the integrated circuit design into the second partition of one or more printed circuit boards that are available.

12. The emulator of claim 11, wherein to determine the availability of the one or more printed circuit boards in the first partition, the instructions when executed by the one or more computers cause the hardware emulator to: check for one or more of the following: (a) if the first partition of one or more printed circuit boards is in use; (b) if the first partition contains a fault that affects emulation of the integrated circuit design; and (c) if the first partition complies with at least one rule in a set of rules for determining availability.

13. The emulator of claim 12, wherein to remap the integrated circuit design into the second partition, the instructions when executed by the one or more computers cause the hardware emulator to: check each partition in the emulator in sequence until an available partition is found.

14. The emulator of claim 11, wherein the request includes an identification of a partition to be used, and wherein to remap the integrated circuit design into the second partition, the instructions when executed by the one or more computers cause the hardware emulator to: use a partition that is different from the identified partition without recompiling the integrated circuit design.

15. The emulator of claim 11, wherein to remap the integrated circuit design into the second partition, the instructions when executed by the one or more computers cause the hardware emulator to: switch one or more clocks associated with the integrated circuit design to the second partition.

16. The emulator of claim 15, wherein to switch the one or more clocks, the instructions when executed by the one or more computers cause the hardware emulator to: program the one or more clocks to a speed needed by the integrated circuit design.

17. The emulator of claim 11, wherein to remap the integrated circuit design into the second partition, the instructions when executed by the one or more computers cause the hardware emulator to: parse the request into a partition address portion and a data portion and change the partition address portion based on the remapping.

18. The emulator of claim 11, wherein a first user design is being emulated in the first partition at a time of receiving the request, and wherein the instructions when executed by the one or more computers cause the hardware emulator to remap the integrated circuit design into the second partition without affecting the first user design.

19. The emulator of claim 11, wherein a user can define a partition size so as to affect a granularity of the remapping.

20. The emulator of claim 11, wherein the instructions when executed by the one or more computers cause the hardware emulator to remap the integrated circuit design into the second partition while a user design is being emulated in the first partition without disrupting that emulation.

* * * * *